(12) United States Patent
Cunningham et al.

(10) Patent No.: US 12,381,122 B2
(45) Date of Patent: Aug. 5, 2025

(54) COATED ARTICLES THAT DEMONSTRATE MOISTURE RESISTANCE, SUITABLE FOR USE IN ELECTRONIC PACKAGES

(71) Applicant: ACULON, INC., San Diego, CA (US)

(72) Inventors: Donald Cunningham, Dallas, TX (US); Eric L. Hanson, Carlsbad, CA (US); Eric L. Bruner, La Jolla, CA (US)

(73) Assignee: ACULON INC., San Diego, CA (US)

( * ) Notice: Subject to any disclaimer, the term of this patent is extended or adjusted under 35 U.S.C. 154(b) by 253 days.

(21) Appl. No.: 18/144,715

(22) Filed: May 8, 2023

(65) Prior Publication Data
US 2023/0274995 A1 Aug. 31, 2023

Related U.S. Application Data

(63) Continuation-in-part of application No. 17/066,722, filed on Oct. 9, 2020, now abandoned.

(60) Provisional application No. 62/912,819, filed on Oct. 9, 2019.

(51) Int. Cl.
| | | |
|---|---|---|
| H05K 5/00 | (2025.01) | |
| G06F 1/16 | (2006.01) | |
| H01L 23/00 | (2006.01) | |
| H01L 23/29 | (2006.01) | |

(Continued)

(52) U.S. Cl.
CPC ........ *H01L 23/3135* (2013.01); *H01L 23/293* (2013.01); *H01L 23/295* (2013.01); *H01L 23/296* (2013.01); *H01L 24/48* (2013.01); *H01L 23/3121* (2013.01); *H01L 2224/48091* (2013.01); *H01L 2224/48245* (2013.01)

(58) Field of Classification Search
CPC . H01L 23/3135; H01L 23/293; H01L 23/295; H01L 23/296; H01L 23/3121; H01L 24/48; H01L 24/49; H01L 24/47
See application file for complete search history.

(56) References Cited

U.S. PATENT DOCUMENTS

| | | | | |
|---|---|---|---|---|
| 4,345,057 A | * | 8/1982 | Yamabe | C08F 214/186 526/247 |
| 5,343,073 A | * | 8/1994 | Parthasarathi | H01L 23/49582 257/781 |

(Continued)

*Primary Examiner* — Anthony M Haughton
(74) *Attorney, Agent, or Firm* — Blynn L. Shideler; Krisanne Shideler; BLK Law Group

(57) ABSTRACT

Coated electronic components of a circuit assembly are provided, comprising: one or more lead frames, one or more chips, connection wires, a moisture barrier coating layer, and an encapsulating plastic coating layer. The moisture barrier coating layer may be applied to the electronic component with the encapsulating plastic coating layer applied on top of the moisture barrier coating layer, or vice versa; such that only lead frames are exposed. Also provided are electronic components of a circuit assembly, comprising: one or more lead frames, one or more chips, connection wires, one or more leads extending from the coated electronic component, a moisture barrier coating layer, and an encapsulating plastic coating layer. The encapsulating plastic coating layer is applied to the electronic component and the moisture barrier coating layer is applied on top of the entire encapsulating plastic coating layer on all sides, such that only the leads are exposed.

19 Claims, 1 Drawing Sheet

(51) Int. Cl.
*H01L 23/31* (2006.01)
*H05K 7/00* (2006.01)

(56) References Cited

U.S. PATENT DOCUMENTS

| | | | | |
|---|---|---|---|---|
| 6,154,366 | A * | 11/2000 | Ma | H01L 24/19 257/796 |
| 6,852,567 | B1 * | 2/2005 | Lee | H01L 23/3142 257/788 |
| 8,432,036 | B2 * | 4/2013 | Hanson | H01L 23/49582 257/734 |
| 8,994,157 | B1 * | 3/2015 | Kiew | H01L 21/561 257/784 |
| 2010/0244286 | A1 * | 9/2010 | Lagsa | C08J 5/005 257/E23.116 |
| 2014/0170344 | A1 * | 6/2014 | Pramanik | B32B 15/085 428/458 |
| 2014/0170644 | A1 | 6/2014 | Pramanik | |
| 2018/0240743 | A1 * | 8/2018 | Lee | H01L 23/49894 |
| 2023/0137612 | A1 * | 5/2023 | Flauta | H01L 23/3135 257/676 |
| 2023/0378010 | A1 * | 11/2023 | Balaraman | H01L 25/072 |

* cited by examiner

COATED ARTICLES THAT DEMONSTRATE MOISTURE RESISTANCE, SUITABLE FOR USE IN ELECTRONIC PACKAGES

CROSS-REFERENCE TO RELATED APPLICATIONS

This application is a continuation-in-part of U.S. patent application Ser. No. 17/066,722, filed Oct. 9, 2020, and titled "COATED ARTICLES THAT DEMONSTRATE MOISTURE RESISTANCE, SUITABLE FOR USE IN ELECTRONIC PACKAGES", which in turn claims priority to provisional U.S. Patent Application Ser. No. 62/912,819, filed Oct. 9, 2019, and titled "COATED ARTICLES THAT DEMONSTRATE MOISTURE RESISTANCE, SUITABLE FOR USE IN ELECTRONIC PACKAGES", both of which are incorporated herein by reference in their entireties.

FIELD OF THE INVENTION

The present invention relates to coated articles that demonstrate moisture resistance in electronic packages.

BACKGROUND OF THE INVENTION

An electronic circuit package, or assembly, comprises many individual components including, for example, resistors, transistors, capacitors, etc. These components are interconnected to form circuits, and circuits are likewise interconnected to form units having specific functions. In microelectronic circuit packages, circuits and units are prepared in packaging levels of increasing scale. The smallest scale packaging levels are typically semiconductor chips housing multiple microcircuits and/or other components. Such chips are usually made from ceramics, silicon, and the like. Intermediate package levels ("chip carriers") comprising multi-layer substrates may have attached thereto a plurality of small-scale chips housing many microelectronic circuits. The intermediate package levels serve several purposes in the circuit assembly including structural support, transitional integration of the smaller scale microcircuits and circuits to larger scale boards, and the dissipation of heat from the circuit assembly. In turn, these intermediate package levels are themselves attached to larger scale circuit cards, motherboards, and the like.

A lead frame is used as the electrical connection between a semiconductor chip and a printed circuit board (and thus to other electrical components), such as in a flat no-lead package, including quad-flat no-leads (QFN) and dual-flat no-leads (DFN). Lead frames are typically constructed of a base metal such as copper, a copper alloy, iron, or an iron alloy. Copper is preferred because of its corrosion resistance, electrical conductivity and solderability. Subsequent metal layers may be deposited onto the base metal to enhance properties such as solderability. It is increasingly popular to plate layers of nickel, palladium and gold in order to get good adhesion of environmentally friendly lead-free solder to the lead frame surface. Lead frames are usually manufactured from a continuous strip of copper or copper metal alloy (optionally plated with additional layers) onto which a pattern is repeatedly stamped or etched comprising a central die pad that multiple inner leads extend out from to outer leads, which form the connection of the package to the board. Then, an adhesive is dispensed onto the die pad and a semiconductor chip comprising one or more dies, often a plurality of dies, is placed on top and the adhesive is cured.

A die is a small block of semiconducting material (such as silicon or GaAs) on which a circuit is fabricated. Electrical connections are then made between the top of the semiconductor chip and the leads via ultrasonically welded thin gold wires. This assembly is quite fragile, so it is usually protected by encapsulating it in an epoxy molding compound that provides mechanical durability to the assembly. After curing, the assembly is sectioned from the adjacent packages and it is connected to a printed circuit board (PCB) by soldering the leadfingers extending from the assembly to pads on the PCB.

Many epoxy style encapsulants used for semiconductor and passive component packaging tend to absorb moisture, which can cause numerous problems such as wirebond corrosion, chip metallization corrosion, lead frame corrosion, package delamination, silver migration, and copper migration at elevated operating temperatures and humidity.

Approaches to solving these problems have included the use of gold as a plate layer, which is less likely to migrate or corrode, but is more expensive; and bulkier package types with hermetic sealing, but such designs are often too big to be feasible in many applications, especially automotive use.

It would be desirable to provide coated articles that deliver the benefits of moisture resistance without the need for costly materials or larger packages.

SUMMARY OF THE INVENTION

Coated electronic components of a circuit assembly are provided comprising:
 (a) one or more lead frames;
 (b) one or more active or passive chips;
 (c) connection wires that provide electrical connection between the lead frames (a) and the active or passive chips (b);
 (d) a moisture barrier coating layer; and
 (e) an encapsulating plastic coating layer that is different from the moisture barrier coating layer; wherein either:
  (1) the moisture barrier coating layer (d) is applied to the electronic component and the encapsulating plastic coating layer (e) is applied on top of the entire moisture barrier coating layer (d) on all sides forming an outermost layer; or
  (2) the encapsulating plastic coating layer (e) is applied to the electronic component and the moisture barrier coating layer (d) is applied on top of the entire encapsulating plastic coating layer (e) on all sides, forming an outermost layer; such that in either (1) or (2) only lead frames are exposed.

Also provided are coated electronic components of a circuit assembly, comprising:
 (a) one or more lead frames;
 (b) one or more active or passive chips;
 (c) connection wires that provide electrical connection between the lead frames (a) and the active or passive chips (b);
 (d) one or more leads extending from the coated electronic component that provide electrical connection between the coated electronic component and a board;
 (e) a moisture barrier coating layer; and
 (f) an encapsulating plastic coating layer that is different from the moisture barrier coating layer; wherein the encapsulating plastic coating layer (f) is applied to the electronic component and the moisture barrier coating layer (e) is applied on top of the entire encapsulating plastic coating layer (f) on all sides, forming an outermost layer; such that only the one or more leads (d) are exposed.

DETAILED DESCRIPTION OF THE INVENTION

Other than in any operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used in this specification and the appended claims, the articles "a," "an," and "the" include plural referents unless expressly and unequivocally limited to one referent.

The various aspects and examples of the present invention as presented herein are each understood to be non-limiting with respect to the scope of the invention.

As used in the following description and claims, the following terms have the meanings indicated below:

The terms "on", "appended to", "affixed to", "bonded to", "adhered to", or terms of like import means that the designated item, e.g., a coating, film or layer, is either directly connected to (in contact with) the object surface, or indirectly connected to the object surface, e.g., through one or more other coatings, films or layers.

Figure 1:
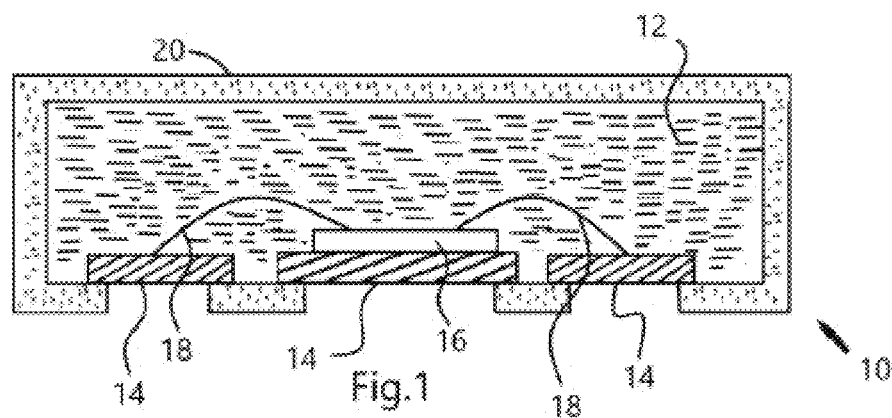
FIG. 1 (FIG. 1) is a cross-sectional side view of an exemplary coated article according to a first embodiment of the present invention, wherein an encapsulating plastic coating layer is applied to the surface of an electrically conductive substrate, with a moisture barrier coating layer applied on top of the encapsulating plastic coating layer.

FIG. 1 illustrates an example of a coated article (electronic component) 10 according to the present invention (a wirebonded lead frame QFN style semiconductor package), wherein an encapsulating plastic coating layer 12 is applied to the substrate (comprising one or more lead frames 14, an active or passive chip 16, and connection wires 18) and a moisture barrier coating layer 20 is applied on top of the encapsulating plastic coating layer 12. The moisture barrier coating layer 20 forms the outermost layer of the coated article 10.

Figure 2:
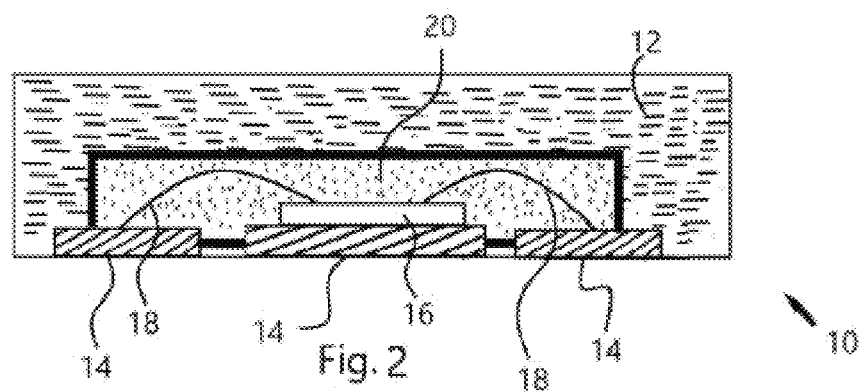
FIG. 2 (FIG. 2) is a cross-sectional side view of an exemplary coated article according to a second embodiment of the present invention, wherein a moisture barrier coating layer is applied to the surface of an electrically conductive substrate, with an encapsulating plastic coating layer applied on top of the moisture barrier coating layer.

FIG. 2 illustrates an example of a coated article (electronic component) 10 according to the present invention (a wirebonded lead frame QFN style semiconductor package), wherein a moisture barrier coating layer 20 is applied to a portion of the substrate (comprising one or more lead frames 14, active or passive chip 16, and connection wires 18) and an encapsulating plastic coating layer 12 is applied on top of the moisture barrier coating layer 20. The encapsulating plastic coating layer 12 forms the outermost layer of the coated article 10.

The coated articles of the present invention comprise (a) a substrate that demonstrates electrical conductivity. Substrates suitable for use in the preparation of the coated articles of the present invention can include a metal such as copper or steel, or any substrate commonly used in the preparation of circuit assemblies, such as polyepoxides, including fiberglass reinforced polyepoxides, polyimides, phenolics, and fluorocarbons. The polymeric substrates may comprise an electrically conductive circuit pattern imprinted in (such as in the case of a blind via) or on the substrate surface. The substrate is an electronic component, such as a lead frame, active or passive chips, wires, and/or any addition interconnect such as solder or flip chip bumps of a circuit assembly. When the substrate comprises a lead frame, the copper base metal is often plated with one or more layers of nickel and/or palladium. Gold may also be used as a plating metal but is usually avoided because of cost and because it is not necessary for corrosion resistance. Note that the phrase "and/or" when used in a list is meant to encompass alternative embodiments including each individual component in the list as well as any combination of components. For example, the list "A, B, and/or C" is meant to encompass seven separate embodiments that include A, or B, or C, or A+B, or A+C, or B+C, or A+B+C.

The substrate may take any shape as desired for the intended application, such as flat, curved, bowl-shaped, tubular, or freeform. For example, the substrate may be in the form of a flat plate having two opposing surfaces, such as would be suitable for use in an electronic circuit assembly as a circuit board.

Prior to application of any coatings, the substrate may be cleaned such as by argon plasma treatment or with a solvent such as Ionox 13416 or Cybersolv 141-R, both available from Kyzen.

The coated articles of the present invention further comprise (b) a moisture barrier coating layer.

A film-forming composition may be used to form the moisture barrier coating layer. The film-forming composition may comprise a polysiloxane and an organometallic compound in a solvent. The polysiloxane may be alkyl and/or aryl substituted; poly(methylphenyl)siloxane and/or polydimethylsiloxane are often used. The polysiloxane additionally comprises terminal groups such as terminal methyl and/or silanol groups. The amount of polysiloxane present in the composition used to prepare the coating layer is typically 2 to 50 percent by weight, based on the total weight of solids in the composition.

The organometallic compound is derived from an organo metal in which the metal comprises a transition metal. Transition metals include elements in the d-block of the periodic table (i. e., having valence electrons in the d orbital), as well as those in the f-block (the lanthanide and actinide series, also called "inner transition metals", having valence electrons in the f orbital.) Typically the metal is selected from at least one of La, Hf, Ta, W, and niobium. The organo portion of the metal is usually an alkoxide containing from 1 to 18, often 2 to 8 carbon atoms such as ethoxide, propoxide, isopropoxide, butoxide, isobutoxide and tertiary butoxide. The alkoxides may be in the form of simple esters and polymeric forms of the esters. For example, with the metal Ta, the simple esters would be $Ta(OR)_5$ where each R is independently C1 to C18 alkyl. Polymeric esters would be obtained by condensation of the alkyl esters mentioned above and typically would have the structure: RO—$[Ta(OR)_3$—O—$]_x$R where each R is independently defined as above and x is a positive integer. Besides alkoxides, other ligands can be present such as acetyl acetonates. Also, ligands such as chloride, acetylacetonate, alkanolamine and lactate, etc. may be present.

Although not intending to be bound by any theory, it is believed that upon application of the coating layer to the substrate, the organometallic compound forms a polymeric metal oxide of the structure $[M(O)_x(OH)_y(OR)_z]_n$ in which M is a transition metal as discussed above. R may be an alkyl group containing from 1 to 30 carbon atoms; $x+y+z=V$, wherein V is the valence of M; x is at least 1; y is at least 1; z is at least 1; $x=V-y-z$; $y=V-x-z$; $z=V-x-y$; and n is greater than 2.

Suitable solvents for use in the composition used to form the moisture barrier coating layer may be organic or inorganic. Exemplary organic solvents include alcohols such as methanol, ethanol and propanol, aliphatic hydrocarbons such as hexane, isooctane and decane; ethers, for example, tetrahydrofuran, and dialkylethers such as diethylether. The concentration of the organometallic compound in the composition is not particularly critical but is usually at least 0.01 millimolar, typically from 0.01 to 100 millimolar, and more typically from 0.1 to 50 millimolar. Commercially available examples of such compositions for use as the moisture barrier coating layer include NANOPROOF 1.0, 3.5 and 4.0, available from Aculon, Inc.

Alternatively, the moisture barrier coating layer may be formed from a composition comprising a fluorinated polymer (fluoropolymer) in a fluorinated solvent (fluorosolvent). Nonlimiting examples of suitable fluoropolymers include fluoroethylene-alkyl vinyl ether alternating copolymers (such as those described in U.S. Pat. No. 4,345,057) available from Asahi Glass Company under the name LUMIFLON; fluoroaliphatic polymeric esters commercially available from 3M of St. Paul, Minnesota under the name FLUORAD; and perfluorinated hydroxyl functional (meth)acrylate resins. The fluoropolymer may, for example, be prepared by polymerizing one or more fluorinated ethylenically unsaturated monomers such as a fluoroethylene or fluoropropylene and fluoro-functional ethylenically unsaturated ester monomers such as fluoro-functional (meth)acrylate monomers and 2-Methyl-2-propenoic acid tridecafluorooctyl ester, with or without non-fluoro-functional ethylenically unsaturated monomers, using conventional polymerization techniques. Other polymers that are suitable for use as the fluorinated polymer include copolymers, such as terpolymers, of vinylidene fluoride, hexafluoropropylene, tetrafluoroethylene and/or perfluoromethylvinyl ether. Examples of such polymers are VITON A-100 and VITON GF-2005, fluoroelastomers commercially available from The Chemours Company. Each of the fluorinated polymers described above may be used individually or in combination with each other. Fluorinated solvents include EnSolv NEXT solvents, available from Envirotech International. Inc.; VERTREL solvents available from E. I. DuPont de Nemours; and FLUORINERT, NOVEC, and HFE-7500 fluorosolvents, all available from 3M. Commercially available examples of such compositions suitable as the moisture barrier coating layer (b) include NANOPROOF 5.0, and NANOPROOF 12.x, available from Aculon, Inc. In this example, the amount of fluorinated polymer present in the composition used to prepare the coating layer is typically 2 to 50 percent by weight, such as 2 to 25 percent by weight, or 4 to 10 percent by weight, based on the total weight of the film-forming composition In another example of the present invention, the moisture barrier coating layer may be formed from a film-forming composition comprising a hydrocarbon polymer in a hydrocarbon solvent. The hydrocarbon polymer may be prepared from any of a number of ethylenically unsaturated monomers such as ethylene, propylene, isobutylene, and the like. For example, the hydrocarbon polymer may comprise a polymer prepared from a reaction mixture comprising isobutylene and optionally polyethylene, polypropylene, polymethylpentene, and/or polybutene-1. Ethylene-propylene-diene compounds (EPDM terpolymers) are particularly suitable.

Suitable hydrocarbon solvents include any of those indicated by the US EPA as VOC-exempt. Under EPA regulations, a chemical is VOC-exempt if it has vapor pressure of less than 0.1 millimeters of mercury (at 20 degrees Celsius); or, if the vapor pressure is unknown, it (i) consists of more than 12 carbon atoms; or (ii) has a melting point higher than 20 degrees C. and does not sublime (i.e., does not change directly from a solid into a gas without melting). Examples of particular solvents that may be used include methyl cyclohexane, toluene, and/or cyclohexane. In this scenario, the amount of hydrocarbon polymer present in the composition used to prepare the coating layer is typically 2 to 50 percent by weight, often 4 to 8 percent by weight, based on the total weight of the film-forming composition.

In a particular example of the present invention, the moisture barrier coating layer may be formed from a film-forming composition comprising at least one terpolymer in a solvent, wherein the terpolymer is prepared from a reaction mixture comprising ethylene, propylene, and a diene. Such terpolymers are often referred to as EPDM terpolymers. Examples of dienes used to prepare the EPDM terpolymers may include 5-ethylidenenorbornene (ENB) and/or dicyclopentadiene (DCPD). Often the diene is present in the reaction mixture in an amount of at least 3 percent by weight, such as 4 to 10 percent by weight, based on the total weight of monomers in the reaction mixture. Suitable EPDM terpolymers include those commercially available from the Dow Chemical Company under the name NORDEL, such as NORDEL 4570, and available from Lion Elastomers under the name TRILENE. Specific examples include TRILENE 65, 65D, 67, and 77. Mixtures of EPDM terpolymers may also be used, such as a mixture of a relatively low molecular weight polymer (e. g., less than 75,000 Da as measured by GPC using a polystyrene standard) and a relatively high molecular weight polymer (e. g., greater than 75,000 Da as measured by GPC using a polystyrene standard). A particularly suitable composition that contains a terpolymer is NANOPROOF 8.4, commercially available from Aculon, Inc.

Suitable solvents for use with the EPDM terpolymer may be selected from any of those disclosed above.

Adjuvant materials may be present in any of the above film-forming compositions. Examples include fillers, viscosity (rheology) modifying components such as shear thinning or thixotropic compounds, stabilizers such as sterically hindered alcohols and acids, surfactants and anti-static agents. Suitable fillers include organic or inorganic fillers and are usually particulate or fibrous. The filler comprises particles and/or fibers that can be formed from materials selected from polymeric and nonpolymeric inorganic materials, polymeric and nonpolymeric organic materials, composite materials, and mixtures of any of the foregoing. The surface of the filler can be modified in any manner well known in the art, including, but not limited to, chemically or physically changing its surface characteristics using techniques known in the art.

For example, a particle or fiber can be formed from a primary material that is coated, clad or encapsulated with one or more secondary materials to form a composite that has a softer surface. Alternatively, fillers formed from composite materials can be formed from a primary material that is coated, clad or encapsulated with a different form of the primary material.

Suitable inorganic fillers can be formed from ceramic materials, metallic materials, and mixtures of any of the foregoing. Suitable ceramic materials comprise metal oxides, metal nitrides, metal carbides, metal sulfides, metal silicates, metal borides, metal carbonates, and mixtures of any of the foregoing. Specific, nonlimiting examples of metal nitrides are, for example boron nitride; specific, nonlimiting examples of metal oxides are, for example zinc oxide; nonlimiting examples of suitable metal sulfides are, for example molybdenum disulfide, tantalum disulfide, tungsten disulfide, and zinc sulfide; nonlimiting suitable examples of metal silicates are, for example aluminum silicates and magnesium silicates such as vermiculite.

Particulate fillers can comprise, for example a core of essentially a single inorganic oxide such as silica in colloidal, fumed, or amorphous form, alumina or colloidal alumina, titanium dioxide, cesium oxide, yttrium oxide, colloidal yttria, zirconia, e.g., colloidal or amorphous zirconia, and mixtures of any of the foregoing; or an inorganic oxide of one type upon which is deposited an organic oxide of another type.

Nonpolymeric, inorganic materials useful in forming the fillers used in the present invention comprise inorganic materials selected from graphite, metals, oxides, carbides, nitrides, borides, sulfides, silicates, carbonates, sulfates, and hydroxides. A nonlimiting example of a useful inorganic oxide is zinc oxide. Nonlimiting examples of suitable inorganic sulfides include molybdenum disulfide, tantalum disulfide, tungsten disulfide, and zinc sulfide. Nonlimiting examples of useful inorganic silicates include aluminum silicates and magnesium silicates, such as vermiculite. Nonlimiting examples of suitable metals include molybdenum, platinum, palladium, nickel, aluminum, copper, gold, iron, silver, alloys, and mixtures of any of the foregoing.

In certain embodiments, the particles are selected from fumed silica, amorphous silica, colloidal silica, alumina, colloidal alumina, titanium dioxide, cesium oxide, yttrium oxide, colloidal yttria, zirconia, colloidal zirconia, and mixtures of any of the foregoing.

As another alternative, a particle can be formed from a primary material that is coated, clad or encapsulated with one or more secondary materials to form a composite material that has a harder surface. Also, a particle can be formed from a primary material that is coated, clad or encapsulated with a differing form of the primary material to form a composite material that has a harder surface.

In one example, an inorganic particle formed from an inorganic material such as silicon carbide or aluminum nitride can be provided with a silica, carbonate or nanoclay coating to form a useful composite particle. In another example, a silane coupling agent with alkyl side chains can interact with the surface of an inorganic particle formed from an inorganic oxide to provide a useful composite particle having a "softer" surface. Other examples include cladding, encapsulating or coating particles formed from nonpolymeric or polymeric materials with differing nonpolymeric or polymeric materials. A specific nonlimiting example of such composite particles is DUALITE™, which is a synthetic polymeric particle coated with calcium carbonate that is commercially available from Pierce and Stevens Corporation of Buffalo, N.Y.

Particles may have a lamellar structure. Particles having a lamellar structure are composed of sheets or plates of atoms in hexagonal array, with strong bonding within the sheet and weak van der Waals bonding between sheets, providing low shear strength between sheets. A nonlimiting example of a lamellar structure is a hexagonal crystal structure. Inorganic solid particles having a lamellar fullerene (i.e., buckyball) structure also are useful in the present invention.

Nonlimiting examples of suitable materials having a lamellar structure that are useful in forming the fillers used in the present invention include boron nitride, graphite, metal dichalcogenides, mica, talc, gypsum, kaolinite, calcite, cadmium iodide, silver sulfide, and mixtures of any of the foregoing. Suitable metal dichalcogenides include molybdenum disulfide, molybdenum diselenide, tantalum disulfide, tantalum diselenide, tungsten disulfide, tungsten diselenide, and mixtures of any of the foregoing.

The particles can be formed from nonpolymeric, organic materials. Nonlimiting examples of nonpolymeric, organic materials useful in the present invention include, but are not limited to, stearates (such as zinc stearate and aluminum stearate), diamond, carbon black, and stearamide.

The particles can be formed from inorganic polymeric materials. Nonlimiting examples of useful inorganic polymeric materials include polyphosphazenes, polysilanes, polysiloxane, polygeremanes, polymeric sulfur, polymeric selenium, silicones, and mixtures of any of the foregoing. A specific, nonlimiting example of a particle formed from an inorganic polymeric material suitable for use in the present invention is TOSPEARL 20, which is a particle formed from cross-linked siloxanes and is commercially available from Toshiba Silicones Company, Ltd. of Japan.

The particles can be formed from synthetic, organic polymeric materials. Nonlimiting examples of suitable organic polymeric materials include, but are not limited to, thermoset materials and thermoplastic materials. Nonlimiting examples of suitable thermoplastic materials include thermoplastic polyesters such as polyethylene terephthalate, polybutylene terephthalate, and polyethylene naphthalate, polycarbonates, polyolefins such as polyethylene, polypropylene, and polyisobutene, acrylic polymers such as copolymers of styrene and an acrylic acid monomer, and polymers containing methacrylate, polyamides, thermoplastic polyurethanes, vinyl polymers, and mixtures of any of the foregoing.

Nonlimiting examples of suitable thermoset materials include thermoset polyesters, vinyl esters, epoxy materials, phenolics, aminoplasts, thermoset polyurethanes, and mixtures of any of the foregoing. A specific, nonlimiting example of a synthetic polymeric particle formed from an epoxy material is an epoxy microgel particle. A thermoset material has formed a crosslinked network. As used herein, a polymeric material is "crosslinked" if it at least partially forms a polymeric network. One skilled in the art will understand that the presence and degree of crosslinking (crosslink density) can be determined by a variety of methods, such as dynamic mechanical thermal analysis (DMTA) using a TA Instruments DMA 2980 DMTA analyzer conducted under nitrogen. This method determines the glass transition temperature and crosslink density of free films of coatings or polymers. These physical properties of a cured material are related to the structure of the crosslinked network.

According to this method, the length, width, and thickness of a sample to be analyzed are first measured, the sample is tightly mounted to the Polymer Laboratories MK III apparatus, and the dimensional measurements are entered into the apparatus. A thermal scan is run at a heating rate of 3.degree. C./min, a frequency of 1 Hz, a strain of 120%, and a static force of 0.01N, with sample measurements occurring every two seconds. The mode of deformation, glass transition temperature and crosslink density of the sample can be determined according to this method. Higher crosslink density values indicate a higher degree of crosslinking in the coating.

The particles also can be hollow particles formed from materials selected from polymeric and nonpolymeric inorganic materials, polymeric and nonpolymeric organic materials, composite materials, and mixtures of any of the foregoing. Nonlimiting examples of suitable materials from which the hollow particles can be formed are described above. In one embodiment, the hollow particles are hollow glass spheres.

The adjuvants, if present, are individually present in amounts of up to 30 percent by weight based on the non-volatile (solids) content of the composition.

The compositions used to form the moisture barrier coating layer can be prepared by mixing all of the components at the same time with low shear mixing or by combining the ingredients in several steps. The organometallic compounds are reactive with moisture, and care should be taken when organometallic compounds are used that moisture is not introduced with the solvent or adjuvant materials and that mixing is conducted in a substantially anhydrous atmosphere.

The moisture barrier coating layer may be applied to all, or a portion, of at least one surface of the substrate. The moisture barrier coating layer can be applied to the substrate surface by conventional means such as dipping, rolling, spraying, wiping to form a film, jet printing, or by dispensing such as with a syringe. Portions of the substrate that are to remain exposed (for subsequent attachment to other package components such as by soldering) may be masked to prevent application of any coatings to the substrate surface. Alternatively, any coating that is applied to a portion of the substrate surface that needs to be exposed may be removed by conventional means. Such an embodiment is illustrated in FIG. 1. After application of the moisture barrier coating layer, any solvent in the film-forming composition is permitted to evaporate and curing of any reactive functional groups may occur. This can be accomplished by heating to 50-200° C. or by simple exposure to ambient temperature, which is usually from 20-25° C.

The moisture barrier coating layer typically has a dry film thickness (DFT) of 10 nm to 100 microns, such as 10 to 100 nm, or 10 to 80 nm, or 10 to 50 nm, or 10 to 100 microns, or 50 to 100 microns, or 80 to 100 microns, depending on the composition of the coating layer and the method of application to the substrate. For example, a spray-applied composition may have a dry film thickness of 100 to 200 nm. Spray-applied compositions comprising polysiloxanes and organometallic compounds may range in thickness from 10 to 15 microns, while the same compositions may demonstrate a dry film thickness of 20 to 25 microns when dispensed.

The term "cure", "cured" or similar terms, as used in connection with a cured or curable composition, e.g., a "cured composition" of some specific description, means that at least a portion of any polymerizable and/or crosslinkable components that form the curable composition is polymerized and/or crosslinked. Additionally, curing of a composition refers to subjecting said composition to curing conditions such as those listed above, leading to the reaction of the reactive functional groups of the composition. The term "at least partially cured" means subjecting the composition to curing conditions, wherein reaction of at least a portion of the reactive groups of the composition occurs. The composition can also be subjected to curing conditions such that a substantially complete cure is attained and wherein further curing results in no significant further improvement in physical properties, such as hardness.

The coated articles of the present invention further comprise (c) an encapsulating plastic coating layer, which is different from the moisture barrier coating layer. The moisture barrier coating layer may be applied to at least a portion of the surface of the substrate with the encapsulating plastic coating layer applied on top of the moisture barrier coating layer, shown in FIG. 2. Alternatively, the encapsulating plastic coating layer may be applied to the surface of the substrate with the moisture barrier coating layer applied on top of the encapsulating plastic coating layer, as shown in FIG. 1. In particular examples of the present invention where the encapsulating plastic coating layer is applied first, i.e., onto the substrate surface, an adhesive coating layer such as the self-assembled monolayer described in U.S. Pat. No. 8,432,036, may be applied as an intervening layer between the substrate surface and the encapsulating plastic coating layer, which is not shown.

The encapsulating plastic coating layer is deposited from (i.e., formed from) a film-forming composition that may comprise a polysiloxane or a polyepoxide (i.e., epoxy). The epoxy may comprise a transfer molded epoxy molding compound, dipped epoxy resin, or an electrostatically sprayed and cured epoxy powder. The respective compositions of the encapsulating plastic coating layer and the moisture barrier coating layer are selected so as to be compatible with each other; i.e., they do not repel each other, which may cause delamination of one or both of the coating layers and may compromise the moisture protection intended by the moisture barrier coating layer.

In a third embodiment of the present invention, a coated electronic component of a circuit assembly (such as a leaded lead frame) is provided, comprising:

(a) one or more lead frames as defined above;
(b) an active or passive chip as defined above;

(c) connection wires such as described above that provide electrical connection between the one or more lead frames (a) and the active or passive chip (b);
(d) one or more leads extending from the coated electronic component that provide electrical connection between the coated electronic component and a board;
(e) a moisture barrier coating layer; and
(f) an encapsulating plastic coating layer that is different from the moisture barrier coating layer; wherein the encapsulating plastic coating layer (f) is applied to the electronic component and the moisture barrier coating layer (e) is applied on top of the entire encapsulating plastic coating layer (f) on all sides, forming an outermost layer; such that only the one or more leads (d) are exposed.

Figure 3:
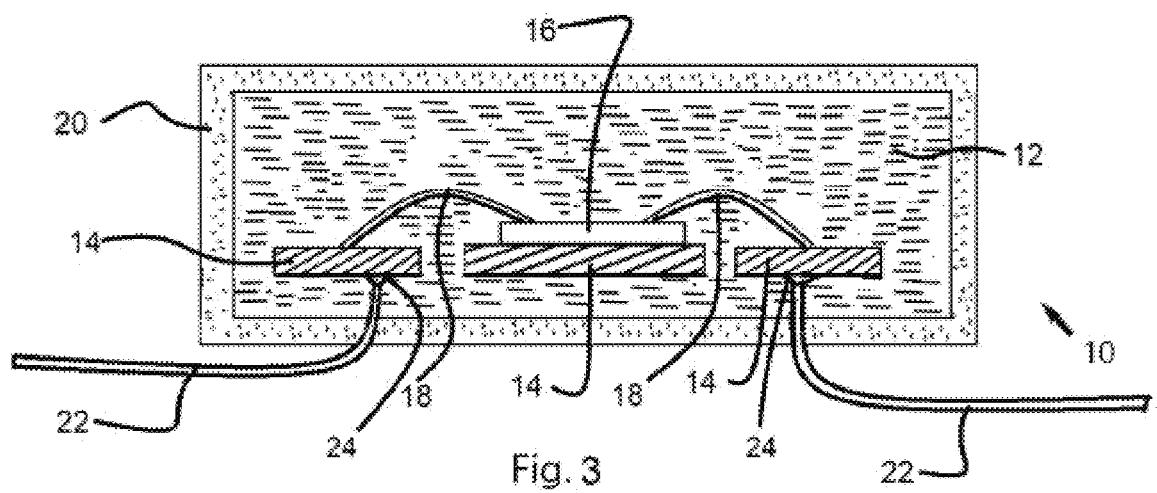
FIG. 3 (FIG. 3) is a cross-sectional side view of an exemplary coated leaded lead frame according to a third embodiment of the present invention, wherein an encapsulating plastic coating layer is applied to the surface of an electrically conductive substrate, with a moisture barrier coating layer applied on top of the entire surface of the encapsulating plastic coating layer, exposing only leads.

FIG. 3 illustrates an example of a coated article 10 according to the present invention (a leaded lead frame style semiconductor package), wherein an encapsulating plastic coating layer 12 is applied to the electronic component (comprising one or more lead frames 14, an active or passive chip 16, and connection wires 18) and a moisture barrier coating layer 20 is applied on top of the encapsulating plastic coating layer 12. The moisture barrier coating layer 20 forms the outermost layer of the coated article 10. Leads 22 may be separate electrical connectors such as wires (shown) or pins, attached to the lead frame via solder joints 24 as shown, or may extend from the lead frames. Only the leads 22 are exposed.

In this embodiment, shown schematically in FIG. 3, the moisture barrier coating layer 20 and the encapsulating plastic coating layer 12 may be any of those described above; most often, the encapsulating plastic coating layer 12 comprises a polyepoxide and the outermost moisture barrier coating layer 20 comprises a polymer prepared from a reaction mixture comprising isobutylene and optionally polyethylene, polypropylene, polymethylpentene, and/or polybutene-1. In this embodiment, the moisture barrier coating layer 20 has a film thickness of at least 20 microns and covers the entire encapsulating plastic coating layer 12.

The coated articles of the present invention are particularly advantageous because the moisture barrier coating layer prevents corrosion of the metal surfaces in the article and prevents package delamination often caused by temperature cycling or when a package is subjected to solder temperatures. The use of the moisture barrier coating layer increases end-product reliability, improves long term electrical performance, and allows the use of lower cost packaging materials. In particular examples of the present invention, the substrate is essentially free of gold; it is not needed as a plated layer on the substrate for corrosion prevention. As used throughout this specification, including the claims, by "essentially free" is meant that a compound is not intentionally present; and if a compound is present in a composition, it is present incidentally in an amount less than 0.1 percent by weight, usually less than trace amounts.

Whereas particular embodiments of this invention have been described above for purposes of illustration, it will be evident to those skilled in the art that numerous variations of the details of the present invention may be made without departing from the scope of the invention as defined in the appended claims.

What is claimed is:
1. A coated electronic component of a circuit assembly, comprising:
    (a) one or more lead frames;
    (b) one or more active or passive chips;
    (c) connection wires that provide electrical connection between the one or more lead frames (a) and the active or passive chip (b);
    (d) a moisture barrier coating layer; and
    (e) an encapsulating plastic coating layer that is different from the moisture barrier coating layer; wherein the moisture barrier coating layer (d) is applied to the electronic component and the encapsulating plastic coating layer (e) is applied on top of the entire moisture barrier coating layer (d) on all sides, forming an outermost layer; such that only lead frames are exposed.

2. The coated electronic component of claim 1, wherein the moisture barrier coating layer is formed from a film-forming composition comprising poly(methylphenyl)siloxane and/or polydimethylsiloxane and an organometallic compound in a solvent; wherein the organometallic compound has the structure $[M(O)_x(OH)_y(OR)_z]_n$, in which M is a transition metal selected from at least one of La, Hf, Ta, W, and Nb; R is an alkyl group containing from 1 to 30 carbon atoms; x+y+z=V, wherein V is the valence of M; x is at least 1; y is at least 1; z is at least 1; x=V−y−z; y=V−x−z; z=V−x−y; and n is greater than 2.

3. The coated electronic component of claim 2 wherein the poly(methylphenyl)siloxane and/or polydimethylsiloxane comprises terminal methyl and/or silanol groups.

4. The coated electronic component of claim 1, wherein the moisture barrier coating layer is formed from a film-forming composition comprising a hydrocarbon polymer in a hydrocarbon solvent, wherein the hydrocarbon polymer comprises (i) a terpolymer prepared from a reaction mixture comprising ethylene, propylene, and a diene; or (ii) polymer prepared from a reaction mixture comprising isobutylene and optionally polyethylene, polypropylene, polymethylpentene, and/or polybutene-1.

5. The coated electronic component of claim 4, wherein the hydrocarbon polymer comprises the terpolymer (i), and wherein the diene comprises 5-ethylidenenorbornene (ENB) and/or dicyclopentadiene (DCPD).

6. The coated electronic component of claim 1, wherein the moisture barrier coating layer is formed from a film-forming composition comprising a fluorinated polymer in a fluorinated solvent, wherein the fluorinated polymer comprises a terpolymer of any three of vinylidene fluoride, hexafluoropropylene, tetrafluoroethylene and perfluoromethylvinyl ether.

7. The coated electronic component of claim 1, wherein the encapsulating plastic coating layer is formed from a film-forming composition comprising a polyepoxide or a polysiloxane.

8. A coated electronic component of a circuit assembly, comprising:
    (a) one or more lead frames;
    (b) one or more active or passive chips;
    (c) connection wires that provide electrical connection between the one or more lead frames (a) and the active or passive chip (b);
    (d) a moisture barrier coating layer; and
    (e) an encapsulating plastic coating layer that is different from the moisture barrier coating layer; wherein the encapsulating plastic coating layer (e) is applied to the electronic component and the moisture barrier coating layer (d) is applied on top of the entire encapsulating plastic coating layer (e) on all sides, forming an outermost layer; such that only lead frames are exposed.

9. The coated electronic component of claim 8, wherein the moisture barrier coating layer is formed from a film-forming composition comprising poly(methylphenyl)siloxane and/or polydimethylsiloxane and an organometallic compound in a solvent; wherein the organometallic compound has the structure $[M(O)_x(OH)_y(OR)_z]_n$ in which M is a transition metal selected from at least one of La, Hf, Ta, W, and Nb; R is an alkyl group containing from 1 to 30 carbon atoms; x+y+z=V, wherein V is the valence of M; x is at least 1; y is at least 1; z is at least 1; x=V−y−z; y=V−x−z; z=V−x−y; and n is greater than 2.

10. The coated electronic component of claim 9 wherein the poly(methylphenyl)siloxane and/or polydimethylsiloxane comprises terminal methyl and/or silanol groups.

11. The coated electronic component of claim 8, wherein the moisture barrier coating layer is formed from a film-forming composition comprising a hydrocarbon polymer in a hydrocarbon solvent, wherein the hydrocarbon polymer comprises (i) a terpolymer prepared from a reaction mixture comprising ethylene, propylene, and a diene; or (ii) polymer prepared from a reaction mixture comprising isobutylene and optionally polyethylene, polypropylene, polymethylpentene, and/or polybutene-1.

12. The coated electronic component of claim 11, wherein the hydrocarbon polymer comprises the terpolymer (i), and wherein the diene comprises 5-ethylidenenorbornene (ENB) and/or dicyclopentadiene (DCPD).

13. The coated electronic component of claim 8, wherein the moisture barrier coating layer is formed from a film-forming composition comprising a fluorinated polymer in a fluorinated solvent, wherein the fluorinated polymer comprises a terpolymer of any three of vinylidene fluoride, hexafluoropropylene, tetrafluoroethylene and perfluoromethylvinyl ether.

14. The coated electronic component of claim 8, wherein the encapsulating plastic coating layer is formed from a film-forming composition comprising a polyepoxide or a polysiloxane.

15. A coated electronic component of a circuit assembly, comprising:

(a) one or more lead frames;
(b) one or more active or passive chips;
(c) connection wires that provide electrical connection between the one or more lead frames (a) and the active or passive chip (b);
(d) one or more leads extending from the coated electronic component that provide electrical connection between the coated electronic component and a board;
(e) a moisture barrier coating layer; and
(f) an encapsulating plastic coating layer that is different from the moisture barrier coating layer; wherein the encapsulating plastic coating layer (f) is applied to the electronic component and the moisture barrier coating layer (e) is applied on top of the entire encapsulating plastic coating layer (f) on all sides, forming an outermost layer; such that only the one or more leads (d) are exposed.

16. The coated electronic component of claim 15, wherein the moisture barrier coating layer is formed from a film-forming composition comprising a hydrocarbon polymer in a hydrocarbon solvent, wherein the hydrocarbon polymer comprises (i) a terpolymer prepared from a reaction mixture comprising ethylene, propylene, and a diene; or (ii) a polymer prepared from a reaction mixture comprising isobutylene and optionally polyethylene, polypropylene, polymethylpentene, and/or polybutene-1.

17. The coated electronic component of claim 16, wherein the hydrocarbon polymer comprises the terpolymer (i), and wherein the diene comprises 5-ethylidenenorbornene (ENB) and/or dicyclopentadiene (DCPD).

18. The coated electronic component of claim 15, wherein the encapsulating plastic coating layer is formed from a film-forming composition comprising a polyepoxide or a polysiloxane.

19. The coated electronic component of claim 15, wherein the moisture barrier coating layer (e) has a film thickness of at least 20 microns.

* * * * *